United States Patent [19]

Yoshino et al.

[11] Patent Number: 4,825,257

[45] Date of Patent: Apr. 25, 1989

[54] PICTURE RECORDING METHOD

[75] Inventors: Shigeru Yoshino; Atsushi Takagi, both of Kanagawa, Japan

[73] Assignee: Fuji Photo Film Co., Ltd., Kanagawa, Japan

[21] Appl. No.: 151,721

[22] Filed: Feb. 3, 1988

[30] Foreign Application Priority Data

Feb. 3, 1987 [JP] Japan ................................. 62-021815
Aug. 17, 1987 [JP] Japan ................................. 62-203192

[51] Int. Cl.$^4$ .............................................. G03B 27/02
[52] U.S. Cl. ......................................... 355/132; 355/83
[58] Field of Search ....................... 355/27, 83, 77, 68, 355/132; 356/434; 250/559, 571, 574

[56] References Cited

U.S. PATENT DOCUMENTS 4,172,659 10/1979 Laska .................................. 355/83 X

*Primary Examiner*—Richard A. Wintercorn
*Attorney, Agent, or Firm*—Sughrue, Mion, Zinn, Macpeak and Seas

[57] ABSTRACT

A method of picture recording in which a surface of a photosensitive material is exposed to light containing a picture image and the exposed surface of the photosensitive material is superposed on an image receiving surface of an image receiving material so as to transfer the picture image obtained on the exposed surface of the photosensitive material onto the image receiving surface of the image receiving material. Judgment is then made as to whether the surface of the image receiving material to be superposed on the photosensitive material is the image receiving surface by using a detection device for detecting an absorption or reflection factor for light of a wavelength peculiar to the image receiving surface before the photosensitive material is superposed on the image receiving material, so that feeding of the image receiving material may be stopped when the judgment proves that the detected surface is not the image receiving surface.

14 Claims, 4 Drawing Sheets

PICTURE RECORDING METHOD

BACKGROUND OF THE INVENTION

The present invention relates to a method of picture recording in which a photosensitive material is exposed to light representing a picture image, and then the photosensitive material is superposed on an image receiving material in order to transfer the picture image into the image receiving material.

DESCRIPTION OF THE PRIOR ART

An example of the picture recording material using a photosensitive composition is disclosed, for example, in Japanese Patent Applications Nos. 60-117089 and 61-278849, filed by the applicant of this application. The recording material is composed of a photosensitive composition in which at least photosensitive silver halide, a reducing agent, a polymer compound, and a color-picture forming material are applied onto a support, while at least the polymer compound and the color-picture forming material are sealed in the same microcapsules.

The picture recording method of recording a picture using photosensitive material and image receiving material is disclosed, for example, in Japanese Patent Application No. 60-121284 filed by the applicant of this application. In the disclosed picture recording method, the photosensitive material is exposed to light representing a picture image to form a latent picture image on the photosensitive material, then the photosensitive material is subjected to heat development so that the polymer compound located in the photosensitive material, at portions thereof where the latent picture image has been formed, is polymerized producing a high molecular compound to thereby harden the microcapsules. Next, the photosensitive material is superposed on the image receiving material which has an image receiving layer onto which the color-picture forming material can be transferred. The photosensitive material and the image receiving material are pressed so as to break at least a portion of the microcapsules at portions where the latent picture image is not located to thereby transfer the color-picture forming material onto the image receiving material, thus obtaining the picture image on the image receiving material.

The picture recording method described above, has the following problems. The image receiving material has an image receiving layer only on one surface thereof. Accordingly, if the surface having no image receiving layer is erroneously superposed on the exposed surface of the photosensitive material, the picture image can not be transferred at all. Further, the image receiving layer may act like an adhesive agent so that the image receiving material adheres around the pressing member (for example, a pressing roller) making it very difficult to remove resulting paper jams. Even after removal of a paper jam, it is necessary to cleanse the pressing member because the pressing member is dirtied by the substances contained in the image receiving layer. Further, generally, the image receiving material is substantially colorless and transparent, so that it is difficult to visually distinguish the surface having the image receiving layer from the other surface having no image receiving layer. Also in this regard, it is possible that not only the wrong surface of the image receiving material having no image receiving layer is erroneously taken as described above, but also that an improper material, which is similar to but not the image receiving material, is erroneously used.

Various kinds of apparatuses have been used as the picture recording apparatus. In some of those apparatuses, it is necessary to make a distinction between the front and rear surfaces of a sheet-like material used as a recording material. For example, it is necessary to make a distinction between the front and rear surfaces of a picture recording material used in the picture recording apparatus disclosed in Japanese Patent Unexamined Publication No. 61-275742 filed by the present applicant. The recording material used in the disclosed picture recording apparatus is composed of a photosensitive composition in which at least photosensitive silver halide, a reducing agent, a polymer compound, and a color-picture forming material are applied onto a support, at least the polymer compound and the color-picture forming material being sealed in the same microcapsules.

SUMMARY OF THE INVENTION

It is therefore an object of the present invention to solve the above problems in the prior art.

It is another object of the present invention to provide a picture recording method in which a picture image transfer step is carried out only when the exposed surface of the photosensitive material and the image receiving surface of the image receiving material are superposed on each other.

It is a further object of the present invention to provide a sheet-material surface distinguishing method in order to solve the above problems.

In order to attain the above objects, according to an aspect of the present invention, after a surface of a photosensitive material is exposed to light containing a picture image, and the exposed surface of the photosensitive material is superposed on an image receiving surface of an image receiving material so as to transfer the picture image obtained on the exposed surface of the photosensitive material onto the image receiving surface of the image receiving material, judgment is made as to whether the surface of the image receiving material to be superposed on the photosensitive material is the image receiving surface by using a detection device for detecting an absorption or reflection factor for light of a wavelength peculiar to the image receiving surface before the photosensitive material is superposed on the image receiving material, so that feeding of the image receiving material is stopped when the judgment proves that the detected surface is not the image receiving surface.

Most of the substances used for the image receiving layer applied onto the image receiving surface of the image receiving material generally act to absorb/reflect light of a specific ultraviolet wavelength. The sheet used as a base of the image receiving material does not significantly absorb or reflect the light of this specific wavelength but shows a substantially flat reflection characteristic.

That is, according to the method of the present invention, when the specific wavelength of the light which can be absorbed or reflected on the image receiving layer applied onto the image receiving surface of the image receiving material is detected on a surface by the detection device, it is determined that the detected surface is the image receiving surface and the operation is shifted to the picture image transfer step. If the specific wavelength is not detected, it is determined that the detected surface is not the image receiving surface and feeding of the image receiving material is stopped. Thus, the picture image transfer is carried out only when the image receiving surface of the image receiving material is properly superposed on the photosensitive material.

According to another aspect of the present invention, the method of making a distinction between front and rear surfaces of a sheet material comprises the steps of: setting a boundary value between values of mirror-reflection light quantities on the front and rear surfaces of the sheet material at a predetermined incident angle; measuring a value of mirror reflection light quantity on one of the opposite surfaces of the sheet material at the predetermined incident angle; and comparing the measured value with the boundary value so as to judge whether the one surface is the front surface or the rear surface of the sheet material.

In a generally used sheet material such as an image receiving material as described above, a heat sensitive sheet, a pressure-sensitive sheet, or the like, substances are applied onto one of the opposite surfaces of the sheet material, so that the surface condition is somewhat different between the surface carrying the substances and the other surface carrying no substances.

Further, the glossiness and the mirror reflection angle at which the glossiness becomes maximum on a given surface vary depending on surface treatment carried out on the surface. Accordingly, front and rear surfaces have different degrees of glossiness if the front and rear surfaces are subject to different forms of surface treatment. As a result, if the glossiness is measured on the front and rear surfaces at a mirror angle where the difference in glossiness between the front and rear surfaces is maximum, it is possible to make a distinction between the front and rear surfaces by comparing the measured values of glossiness on the front and rear surfaces with each other.

It is necessary to measure the whole quantity of the reflected light to obtain the glossiness, and thus a complicated apparatus and a somewhat large space is required. If the glossiness is obtained by measuring the mirror reflection light from a light source having a predetermined light quantity instead of the measurement of the whole quantity of reflect light, the structure of the apparatus for making a distinction between the front and rear surfaces can be simplified.

DETAILED DESCRIPTION OF THE PREFERRED EMBODIMENTS

Figure 1:
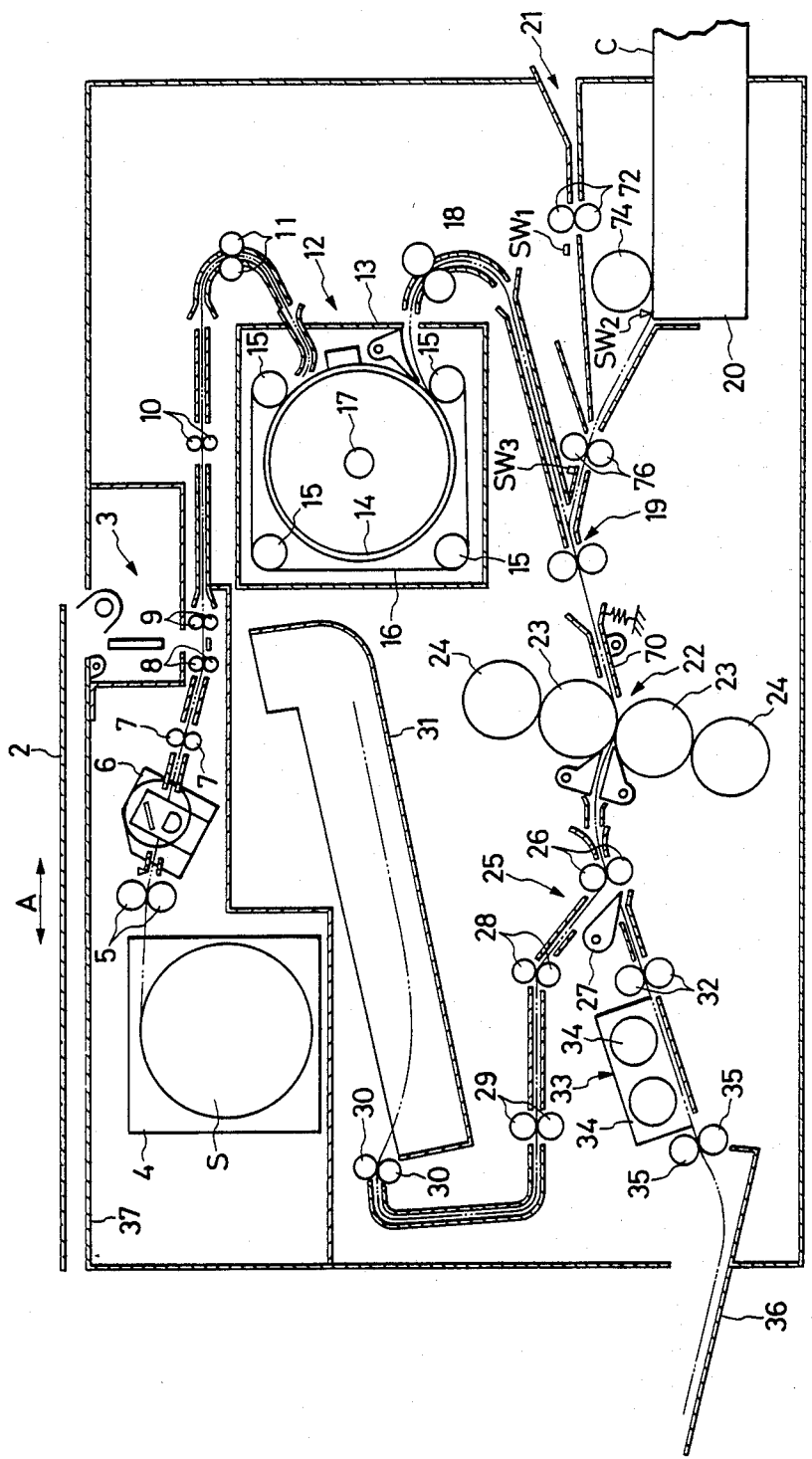
FIG. 1 is a schematic view showing a picture recording apparatus.

Referring to the drawings, an embodiment of the present invention will be described hereunder.

FIG. 1 is a cross-section showing a picture recording apparatus to which the method according to the present invention is applied.

The picture recording apparatus has a supporting transparent glass plate 2 provided on a surface of a housing 1 so as to mount an original on the glass plate 2, and an exposure device 3 provided under the glass plate 2. The exposure device 3 is fixed within the housing 1, and the glass plate 2 is arranged to be horizontally reciprocated on the exposure device 3 as shown by an arrow A by a driving means (not shown).

A photosensitive material S is coiled and housed in a magazine 4 and arranged so as to be taken out from the magazine 4 by means of a pair of pull-out rolls 5. A top cover 37 can be turned about its right end so as to open an inlet to load or remove the magazine 4. The photosensitive material S is cut by a cutter 6 in predetermined lengths while being conveyed to an exposure portion by means of conveying roll pairs 7, 8, and 9. The photosensitive material S is exposed while in the exposure portion.

The photosensitive material S having been cut to form a sheet and having a latent picture image is then conveyed to a heat developing device 12 by means of conveying roll pairs 10 and 11.

The heat developing device 12 is provided, within an adiabatic housing 13, with a hollow cylindrical heating roll 14, four belt-supporting rolls 15, and an endless belt 16 stretched around the belt-supporting rolls 15 and wound on a part of the outer circumference of the heating roll 14 by an angle of about 240°, so that the photosensitive material S is conveyed while being sandwiched between the belt 16 and the heating roll 14 and while being heated at about 120° C. by a halogen lamp 17 provided within the heating roll 14.

The photosensitive material S, heat-developed by the heat developing device 12 and then taken out of the housing 13, is conveyed to a superposing portion 19 through a pair of conveying rolls 18 so as to be superposed on an image receiving sheet C. The image receiving sheet C is fed by a nip roll 74 from an image receiving sheet cassette 20 or fed through a pair of conveying rolls 72 from a manual feeding portion 21, and conveyed through a pair of conveying rolls 76 to the superposing portion 19. The superposed photosensitive material S and image receiving sheet C are then conveyed to a pressure transferring device 22 through rolls at the superposing portion 19.

The pressure transferring device 22 is constituted by a pair of pressure rolls 23 pressed against each other, and a pair of backup rolls 24 in contact with the pressure rolls 23 to press the latter ones, respectively. A pair of blades 70 are provided at the inlet portions of the pressure transferring device 22 so that the forward ends of the respective blades 70 are in elastic contact with the pressure rollers 23 so as to prevent the photosensitive material S and the image receiving sheet C from being crinkled. The photosensitive material S and the image receiving sheet C are pressed by pressure of about 500 kg/cm$^2$. After the picture recored on the photosensitive material S has been transferred onto the image receiving sheet C, the photosensitive material S and the image receiving sheet C are conveyed to a releasing device 25.

The releasing device 25 has a pair of conveying rolls 26 and a releasing claw 27. The releasing claw 27 is arranged so as to be swung at the downstream of the conveying rolls 26 so that the tip end of the releasing claw 27 enters between the photosensitive material S and the other image receiving sheet C to thereby separate one from the other.

The photosensitive material S peeled off from the image receiving sheet C by the releasing and the image receiving sheet C to thereby separate one from the other.

The photosensitive material S peeled off from the image receiving sheet C by the releasing device 25 is conveyed to a waste tray 31 through conveying roll pairs 28, 29 and 30 so as to be discharged into the tray 31. On the other hand, after being peeled off from the photosensitive material S, the image receiving sheet C carrying the picture transferred thereon is conveyed to a fixing device 33 through a pair of conveying rolls 32. The image receiving sheet C is irradiated with ultraviolet rays emitted from, for example, ultraviolet lamps 34 provided in the fixing device 33 so that the picture is fixed. Then, the image receiving sheet C is taken out into a take-out tray 36 by a pair of conveying rolls 35.

The method of producing the image receiving sheet C used in the embodiment will be described hereunder. 11 grams of 40% sodium hexametophosphate aqueous solution is added to 125 g of water. 34g of zinc 3.5-di-$\alpha$-methylbenzyl-salicylate and 82 g of 55% calcium carbonate slurry are mixed to the above aqueous solution and roughly dispersed by a mixer. The thus obtained liquid is dispersed by a dispersing machine. 6 g of 50% SBR latex and 55 g of 8% polyvinyl alcohol are added to 200 g of the above dispersed liquid and equally mixed. The mixed liquid is equally applied onto a sheet of art paper having a weighing capacity of $43/m^3$. to a wet film thickness of 40 $\mu m$ and then the sheet of art paper is dried.

Figure 2:
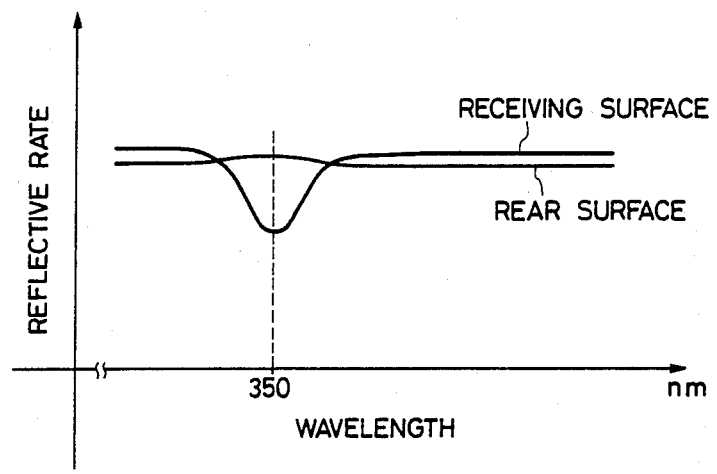
FIG. 2 is a graph showing a spectral reflective characteristic of an image receiving sheet.

As shown in FIG. 2, the image receiving surface of the above-mentioned image receiving sheet C is the above-mentioned image receiving sheet C is remarkably different in spectral reflective characteristic from the rear surface of the same in the vicinity of a wavelength of 350 nm. A reference value is set between the respective values of the reflectivity of the image receiving surface and the rear surface in the vicinity of the wavelength of 350 nm, and the reflectivity of the surface of the fed image receiving sheet C is measured, so that it is judged that the measured surface is the image receiving surface if the reflectivity of the measured surface shows a value smaller than the reference value while the measured surface is the rear surface of the image receiving layer if the reflectivity of the measured surface shows a value larger than the reference value.

Figure 3:
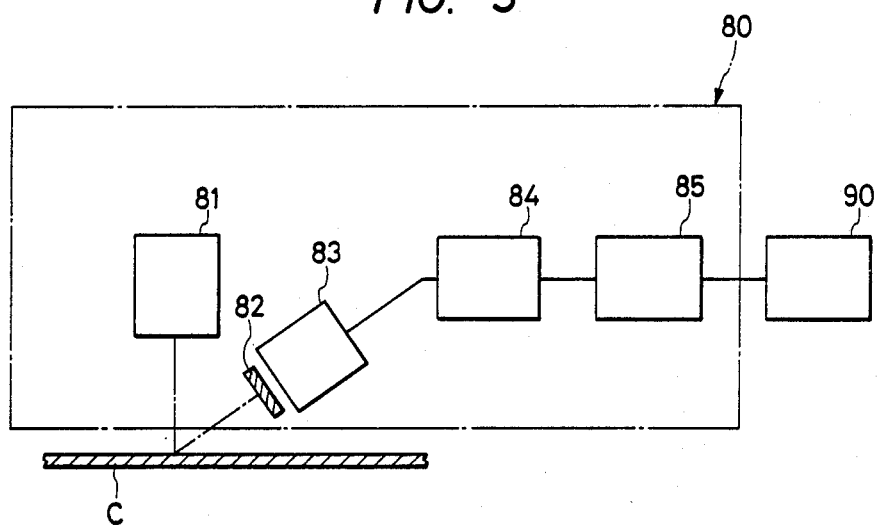
FIG. 3 is a schematic view showing a detection device.

A detection device 80 as shown in FIG. 3 is provided at each of a position $SW_1$ just after the conveying rolls 72 and a position $SW_2$ just after the nip roll 74, or at a position $SW_3$ just after the conveying rolls 76 in FIG. 1.

In the detection device 80, if the image receiving sheet C is fed from the image receiving sheet cassette 20 or fed manually, light radiated from a light source 81 (for example, a xenon flash lamp) including a light component of a wavelength in the vicinity of 350 nm is reflected on the image receiving sheet C, and passed through a filter 82 which passes only the light of a wavelength in the vicinity of 35 nm so that only the light component necessary for the judgment is made to be incident into an optical sensor 83 (for example, a silicon single-crystal photo-diode). An output signal produced from the optical sensor 83 is amplified by a sensor-output amplifier 84 and is applied to a decision device 85. In the decision device 85 having the above-mentioned reference value set in advance, an output signal from the sensor-output amplifier 84 is compared with the reference value, so that if the output signal is larger than the reference value, a signal indicating that the surface reflecting the light is not the image receiving surface is sent to a paper-feeding controlling device 90. The paper-feeding controlling device 90 stops feeding the image receiving sheet C at once. On the either hand, if the output signal from the sensor-output amplifier 84 is smaller than the reference value, the decision device 85 judges that the surface reflecting the light is the image receiving surface so that the image receiving sheet C is fed so as to be subjected to picture transfer.

Thus, the picture image transfer is not performed if the wrong surface of the image receiving receiving sheet C is erroneously fed. Further, it is needless to say that the same effect can be obtained in the case where ordinary paper having no image receiving layer is fed.

Although the image receiving surface is judged by measuring only one of the opposite surfaces of the image receiving sheet C in the method described above, it is possible to judge whether the superposed surface is the image receiving surface or not without using the reference value, e.g., by measuring both of the surfaces by the detection device and comparing the measured values with each other.

It should be understood that the present invention is not limited to the composition of the image receiving layer as described in the above embodiment, but is applicable to any other image receiving layer so long as the layer has a specific spectral reflective characteristic.

Although the embodiment of the picture recording method which has been described employs pressure transfer, the present invention is not limited to this, but can be applied to a picture recording method in which development and transfer are simultaneously performed by heating.

Next, the method of making a distinction between the front and rear surfaces of a sheet material used in a picture recording apparatus or the like will be described hereunder by way of example with reference to the picture recording apparatus shown in FIG. 5. However, it is needless to say that application of the method according to the present invention is not limited to the apparatus of FIG. 5.

An original supporting glass plate 2 is attached on an upper surface of a housing 1, and an exposure optical system portion 200 is provided under the glass plate 2. The exposure portion 200 and a lower unit 3 are separated by a partition wall 4.

A photosensitive-material cartridge 14 for accommodating a photosensitive material roll 12 on which a photosensitive material S is wound is removably attached to a side portion of the housing 1. The photosensitive material S fed from the photosensitive material cartridge 14 is cut by a cutter unit 20 into a predetermined length and is irradiated at an exposure portion 30 by light radiated along an optical axis representing a picture image, so that a latent picture image is formed on the photosensitive material S.

The photosensitive material S exposed at the exposure portion 30 is heat-developed by a heat-developing device 40, the developed photosensitive material S is superposed by a superposing device 70 onto an image receiving sheet C fed from an image receiving-sheet feeding device 60, and the image receiving sheet C and the photosensitive material S are pressed by a pressure of about 500 Kg/cm$^2$ by a pressure transfer device 80 to thereby perform picture image transfer.

After the picture image pressure transfer, the photosensitive material S and the image receiving sheet C are peeled off from each other by a releasing device 90, and the photosensitive material S is discharged to a photosensitive-material waste portion 100. The image receiving sheet C is fixed by a fixing device 110 and is taken out into a take-out tray 130.

Figure 4:
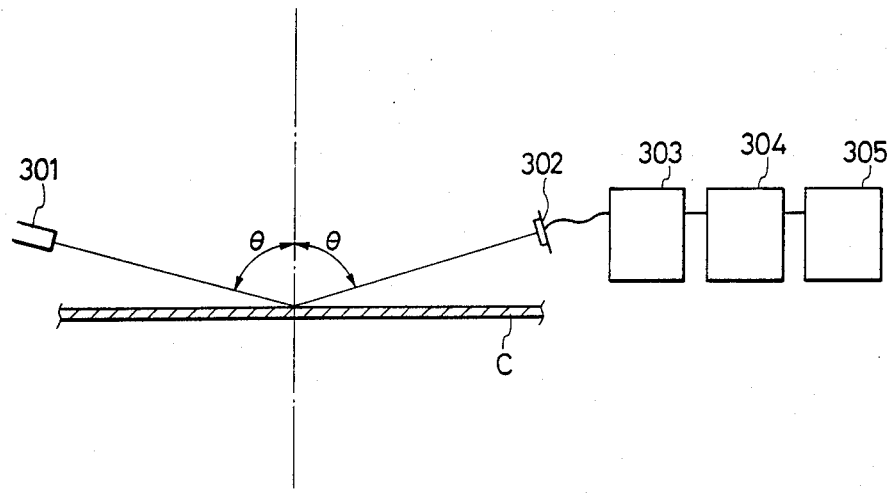
FIG. 4 is a schematic view showing the method according to the present invention.

FIG. 4 is a schematic view showing the sheet-material surface distinguishing method. The distinguishing device must be disposed before the image receiving sheet C enters the superposing device 70 in the picture recording apparatus described above in order to be used for making distinction between the front and rear surfaces of the image receiving sheet C.

A photo-detecting element 302 is disposed at a position so that it can receive the mirror-reflection light at a predetermined incident angle, of the light radiated from a light source 301 toward the image receiving sheet C, and an output signal corresponding to the quantity of the received light and produced from the light detecting element 302 is amplified by an amplifier 303. An output signal from the amplifier 303 is applied to a distinguishing device 304 having a preset boundary value of glossiness between the respective values of glossiness of the front and rear surfaces of the sheet material, so that the output signal of the amplifier 303 is compared with the boundary value so as to distinguish between the front and rear surfaces of the sheet material. A sheet-feeding control device 305 receives a surface distinguishing signal from the distinguishing device 304 and controls the feeding of the sheet material to stop or to continuously feed the sheet material.

Figure 5:
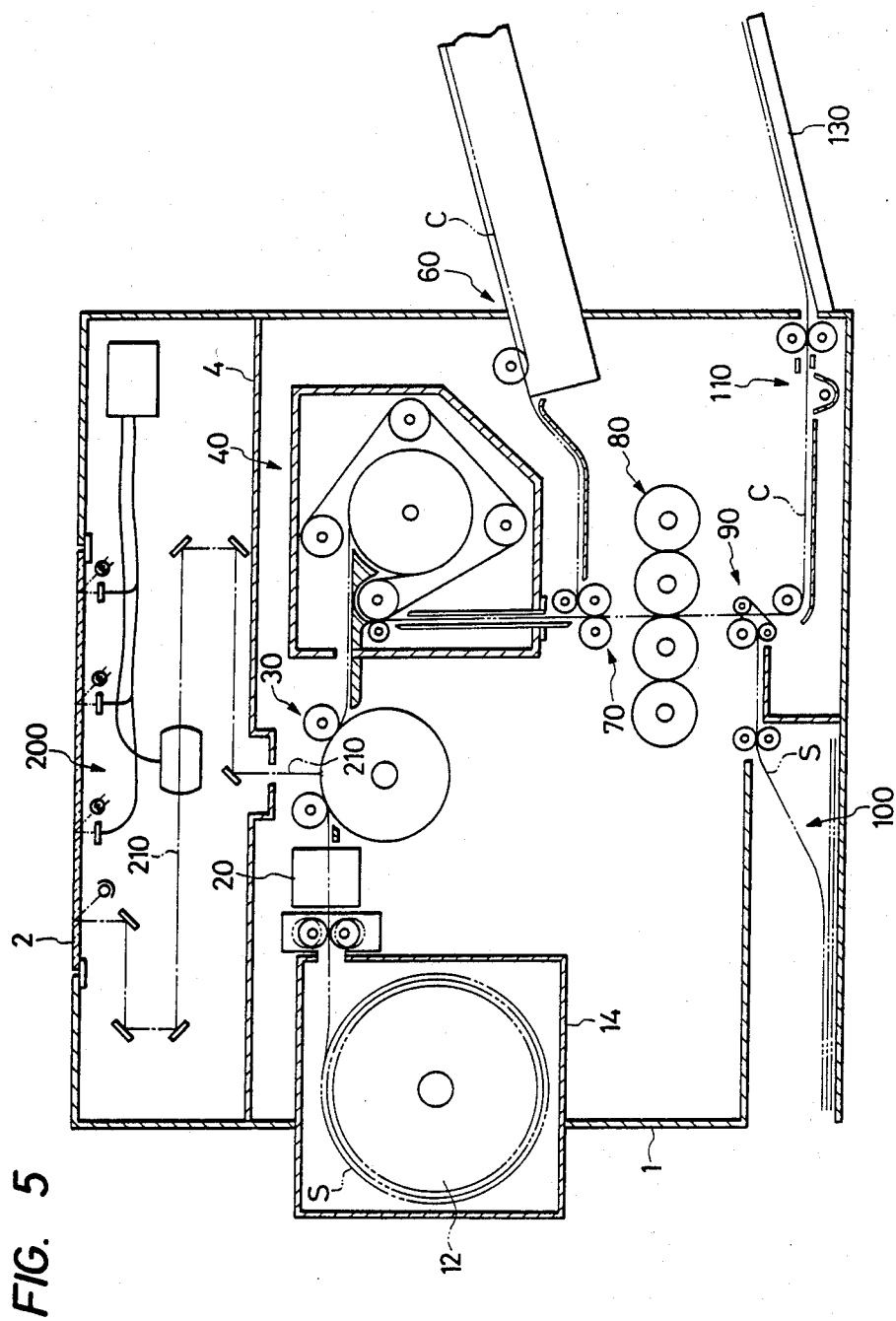
FIG. 5 is a schematic view showing an example of a picture recording apparatus to which the method according to the present invention is applied.

The image receiving sheet used in the picture recording apparatus of FIG. 5 is made, for example, as follows. 11g of a 40% sodium hexametaphosphate aqueous solution is added to 125g of water. 35g of zinc 3.5-di-$\alpha$-methylbenzyl-salicylate and 82g of 55% calcium carbonate slurry are mixed with the above aqueous solution and roughly dispersed by a mixer. The thus obtained liquid is dispersed by a dispersing machine. 6g of 50% SBR latex and 55g of 8% polyvinyl alcohol are added to 200g of the above dispersed liquid and equally mixed. The mixed liquid is equally applied onto a sheet of art paper having a weighting capacity of 43/m$^3$ to a wet film thickness of 40 $\mu$m and then the sheet of art paper is dried.

Figure 6:
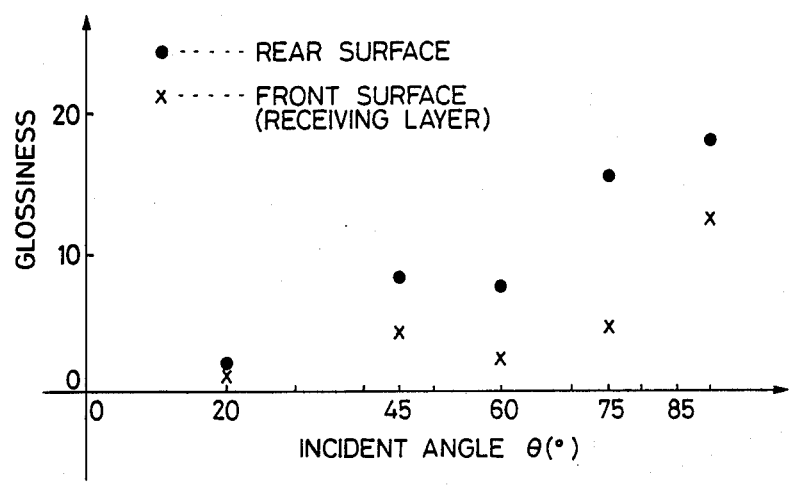
FIG. 6 is a graph showing glossiness of opposite surfaces of the image receiving sheet used in the picture recording apparatus

The glossiness on the front and rear surfaces of the thus obtained image receiving sheet is shown in a graph of FIG. 6. As is apparent from the graph, there is a large difference in glossiness at an incident angel of 75° between the front and rear surfaces. Accordingly, if the surface judgment is carried out with the boundary value determined at the incident angle of 75°, it is possible to positively distinguish between the front and rear surfaces of the sheet material. Even if the boundary value is set at an incident angle within a range of from 45° to 85°, the distinction between the front and rear surfaces can be made. Further, also with respect to a sheet material such as an image receiving sheet, a heat-sensitive sheet, a pressure-sensitive sheet, or the like, of any other composition, it is possible to distinguish between the front and rear surfaces if the incident angle is properly preset so that difference in glossiness between the front and rear surfaces of the sheet material is large.

The glossiness of the image receiving sheet can be raised if the sheet is subject to processing for raising the smoothness of the surface by means of a calendar roller or the like during manufacturing of the sheet support. On the other hand, desired substances may be applied to the image receiving surface (the front surface) so that the surface condition is made rough. Accordingly, the difference in glossiness between the front and rear surfaces of the image receiving sheet can be made large.

Besides visual light provided by means of a luminous diode, any light such as infrared-rays or the like can be used as the light source.

Although the method according to the present invention has been described in the context of distinguishing between the front and rear surfaces of the image receiving sheet having such a composition as described above, the method can be applied also to any sheet other than the image receiving sheet so long as the sheet has a clear difference in glossiness between the front and rear surfaces.

According to the present invention, absorption or reflection light peculiar to the image receiving surface is detected to judge whether the image receiving surface of the image receiving sheet is superposed on the exposed surface of the photosensitive material or not, to thereby control the picture recording operation. Accordingly, an erroneous transfer operation such as erroneous feeding of the image receiving sheet with its surfaces reversed, erroneous feeding of ordinary paper, or the like, can be prevented from occurring, and the transfer member can be prevented from being polluted by substances contained in the image receiving layer.

As described above, by using the difference in glossiness between front and rear surfaces of a sheet material, it is possible to easily and surely make a distinction between the front and rear surfaces of the sheet so that erroneous operation due to reversing of the front and rear surfaces can be prevented from occurring and the post-treatment due to the erroneous operation can be eliminated.

What is claimed:

1. A picture recording method of the type comprising the steps of exposing a surface of a photosensitive material to light representing a picture to form a picture image thereon, superposing said exposed surface of said photosensitive material onto an image receiving surface of an image receiving material and thereafter transferring said the picture image from said exposed surface onto said image receiving surface, said method further comprising the steps of:

optically detecting whether a facing surface of said image receiving material to be superposed on said exposed surface is said image receiving surface; and preventing superposition of said exposed surface of said photosensitive material on said image receiving material when said optical detection step indicates that said facing surface of said image receiving material is not said image receiving surface.

2. A picture recording method as claimed in claim 1, wherein said optical detection step comprises determining one of the reflection and absorption characteristics of said facing surface.

3. A picture recording method as claimed in claim 2, wherein said optical detection step comprises detecting the light reflectance characteristics of said facing surface.

4. A picture recording method as claimed in claim 3, wherein said optical detection step comprises detecting the light reflectance characteristics of said facing surface with respect to a predetermined wavelength of light associated with said image receiving surface.

5. A picture recording method as claimed in claim 2, wherein said optical detection step comprises detecting the light absorption characteristics of said facing surface.

6. A picture recording method as claimed in claim 5, wherein said optical detection step comprises detecting the light absorption characteristics of said facing surface with respect to a predetermined wavelength of light associated with said image receiving surface.

7. A picture recording method as claimed in claim 1, wherein said optical detecting step comprises optically detecting a characteristic of only one side of said image receing material and comparing the detected characteristic to a reference value.

8. A picture recording method as claimed in claim 1, wherein said optical detecting step comprises optically detecting a characteristic of both sides of said image receing material and comparing the detected characteristics of each side to one another.

9. A picture recording method as claimed in claim 1, wherein said optical detection step comprises measuring a value of mirror-reflection light quantity on at least one of the surfaces of said sheet of material at a predetermined incident angle.

10. A picture recording method as claimed in claim 9, wherein said optical detecting step further comprises comparing said measured value to a reference value.

11. A method as claimed in claim 10, wherein said reference value is between the expected values of mirror-reflection light quantities on said front and rear surfaces of said sheet of material at said predetermined incident angle.

12. A picture recording method as claimed in claim 9, wherein said optical detecting step comprises measuring a value of mirror-reflection light quantity of both surfaces of said image receiving material and comparing the measured values to one another.

13. A method of making a distinction between front and rear surfaces of a sheet of material, said method comprising the steps of:
  measuring a value of mirror-reflection light quantity on one of the surfaces of said sheet of material at a predetermined incident angle; and
  comparing said measured value with a reference value to determine whether said one surface is said front surface or said rear surface.

14. A method as claimed in claim 13, wherein said reference value is between the expected values of mirror-reflection light quantities on said front and rear surfaces of said sheet of material at said predetermined incident angle.

* * * * *